(12) United States Patent
Peng et al.

(10) Patent No.: US 7,435,528 B2
(45) Date of Patent: Oct. 14, 2008

(54) PROCESSES AND DEVICES USING POLYCYCLIC FLUOROALKANES IN VACUUM AND DEEP ULTRAVIOLET APPLICATIONS

(75) Inventors: Sheng Peng, Hockessin, DE (US); Weiming Qiu, Wilmington, DE (US); Roger Harquail French, Wilmington, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 385 days.

(21) Appl. No.: 11/149,615

(22) Filed: Jun. 9, 2005

(65) Prior Publication Data

US 2006/0281028 A1 Dec. 14, 2006

(51) Int. Cl.
G03C 1/00 (2006.01)
G03B 27/58 (2006.01)
(52) U.S. Cl. ..................... 430/270.1; 355/47
(58) Field of Classification Search .............. 430/270.1; 570/130; 510/176, 525; 252/408.1, 582
See application file for complete search history.

(56) References Cited

U.S. PATENT DOCUMENTS

| | | | | |
|---|---|---|---|---|
| 6,550,622 | B2* | 4/2003 | Koslow | 210/490 |
| 6,852,393 | B2* | 2/2005 | Gandon | 428/195.1 |
| 2005/0042554 | A1* | 2/2005 | Dierichs et al. | 430/322 |
| 2005/0106512 | A1* | 5/2005 | Endo et al. | 430/495.1 |
| 2005/0173682 | A1* | 8/2005 | Zhang et al. | 252/582 |
| 2005/0175776 | A1* | 8/2005 | Streefkerk et al. | 427/256 |
| 2005/0213066 | A1* | 9/2005 | Sumiyoshi | 355/53 |
| 2006/0232753 | A1* | 10/2006 | Khmelichek et al. | 355/30 |
| 2007/0031755 | A1* | 2/2007 | Hirayama et al. | 430/270.1 |
| 2007/0164261 | A1* | 7/2007 | Miyamatsu et al. | 252/582 |

FOREIGN PATENT DOCUMENTS

WO WO 2005/019937 * 3/2005

OTHER PUBLICATIONS

Switkes et. al., Immersion Lithography at 157 nm, J. Vac. Sci. Technol. B, Nov./Dec. 2001, pp. 2353-2356, vol. 19.
B.A. Lombos et. al., The Electronic Spectra of Normal Paraffin Hydrocarbons, Chemical Physcis Letters, 1967, pp. 42-43, vol. 1.
G. Belanger et. al., The Far-Ultraviolet Spectra of Perfluoro Normal Paraffins, Chemical Physics Letters, 1969, pp. 649-651, vol. 3.
K. Seki et. al., Electronic Structure of Poly(Tetrafluoroethylene) Studied by UPS, VUV Absorption, and Band Calculations, Phys. Scripta, 1990, p. 167, vol. 41.
Switkes et. al., Immersion Lithography: Beyond the 65nm Node With Optics, Microlithography World, 2003, pp. 4-8, vol. 12.

* cited by examiner

*Primary Examiner*—Cynthia H. Kelly
*Assistant Examiner*—Anca Eoff

(57) ABSTRACT

Processes and apparatuses using polycyclic fluoroalkanes that are highly transparent to UV wavelengths ranging from about 190 nm to 260 nm are provided. The polycylic fluoroalkanes are useful in a wide variety of applications, including optical couplants, optical cements, optical elements, optical inspection media for semiconductor wafers and devices, and immersion photolithography, particularly at 193 and 248 nm exposure wavelength.

5 Claims, 6 Drawing Sheets

Figure 1: Immersion Lithography Set-Up

Figure 2, Immersion Contact Lithography Apparatus

Figure 3, Immersion Contact Lithography Wafer Exposure Stage

Figure 4, 193nm contact print, Example 3A, No Immersion Liquid (Air)

Figure 5, 193i contact print,
Example 3B, Example 1 / TAF Topcoat/Photoresist

PROCESSES AND DEVICES USING POLYCYCLIC FLUOROALKANES IN VACUUM AND DEEP ULTRAVIOLET APPLICATIONS

FIELD OF THE INVENTION

The present invention is directed to processes and devices using polycyclic fluoroalkanes that, by virtue of a relatively high refractive index and a relatively high transparency to UV wavelengths, are particularly well-suited for use in optical couplants, optical cements, optical elements, optical inspection media for semiconductor wafers and devices, and immersion photolithography, particularly at 193 and 248 nm exposure wavelength. The polycyclic fluoroalkanes are useful in vacuum and deep ultraviolet applications.

BACKGROUND

Much progress in the electronics industry comes from circuit size reduction. This is most directly accomplished by running photolithographic processes at ever-shorter wavelengths of light. Processes using 193 nanometer (nm) light are undergoing commercialization while 157 nm wavelength light is under development as a next generation candidate.

In immersion photolithography (Switkes et al, *J. Vac. Sci. Technol. B,* 19 (6), 2353 6, November/December 2001) an optical source and a target surface are immersed in a highly transparent high refractive index liquid. As shown by Switkes et al *Microlithography World*, May 2003, pp. 4ff, higher resolution in photolithography can be achieved at a given wavelength of incident light when a high refractive index transmission medium is employed. Realization of the potential benefits of this technology is dependent upon identifying high refractive index liquids having high transparency in the VUV/DUV and excellent photochemical stability.

All known organic materials absorb to some extent UV radiation of 193 nm. The issue is whether liquids can be found that are sufficiently transparent to be practical. Short chain suitable polycyclic fluoroalkanes $H(CH_2)_nH$ and short chain fluorocarbons $F(CF_2)_nF$ are relatively transparent compared to their longer-chain homologues at 193 nm, as disclosed, for example, in B. A. Lombos et al, Chemical Physics Letters, 1, 42 (1967); G. Belanger et al, *Chemical Physics Letters,* 3(8), 649(1969); and K. Seki et al, *Phys. Scripta,* 41, 167(1990).

It is well known in the art that while the addition of fluorine to hydrocarbons generally improves transparency at UV wavelengths, it is usually accompanied by a decrease in refractive index. Particularly for application in the new field of immersion lithography at VUV wavelengths of 193 nm, the refractive index of most hydrofluorocarbons is much too low. Currently, water is the preferred immersion fluid, with good transparency and a refractive index of 1.44. It is desirable to identify highly transparent liquids with refractive index above 1.5.

Gaseous materials may be highly transparent, but can have lower than desired refractive indices. Liquids with low boiling points similarly can have an undesirably low refractive index and require a pressure vessel for containment.

SUMMARY OF THE INVENTION

The present invention provides a process comprising: providing a light source emitting ultraviolet light within the wavelength range of about 190 to about 260 nm; providing a target having a surface; imagewise illuminating at least a portion of a target surface with the emitted light; and disposing in at least a portion of the emitted light between the light source and the target surface a polycyclic fluoroalkane such that at least a portion of the emitted light illuminating the target surface is transmitted through the polycyclic fluoroalkane, the polycyclic fluroalkane having an F/H ratio of 0.5 or less but greater than zero, a refractive index of $\geq 1.50$ and an absorbance at 193 nm of 2.0 $cm^{-1}$ or less.

In preferred embodiments, the polycyclic fluoroalkanes have F/H ratios of 0.3 or less, and refractive indices within the range from 1.5 to 1.7, more preferably from 1.6 to 1.7.

The present invention further provides an apparatus comprising a light source capable of emitting light in the wavelength range of about 190 to about 260 nm, a target surface disposed so that upon activation of the light source at least a portion of the target surface is imagewise illuminated by the light emitted from the light source, and a polycyclic fluoroalkane disposed between the light source and the target surface such that at least a portion of the emitted light illuminating the target surface is transmitted through the polycyclic fluoroalkane; the polycyclic fluroalkane having an F/H ratio of 0.5 or less but greater than zero, a refractive index of at least 1.50, and an absorbance at 193 nm of 2.0 $cm^{-1}$ or less.

These and other aspects of the present invention will be apparent to those skilled in the art, in view of the following disclosure and the appended claims.

DETAILED DESCRIPTION

Figure 1:
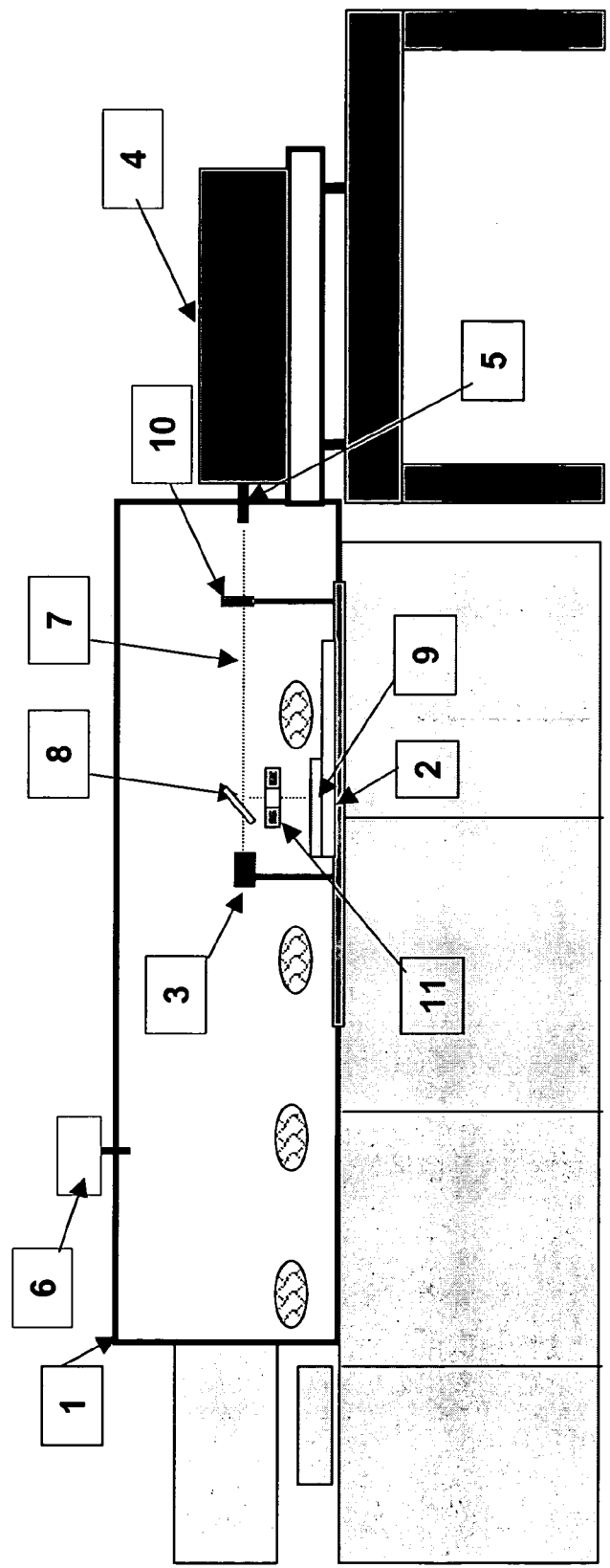
FIG. 1 shows schematically an example of equipment for immersion contact lithography.

The present inventors have discovered that a polycyclic fluoroalkane having an F/H ratio of 0.5 or lower but greater than zero shows surprisingly high suitability for use in imaging applications in the wavelength range of about 190-260 nm (the vacuum ultra-violet—VUV), particularly 193 and 248 nm, as well as other applications requiring high transparency condensed phase optical components such as optical adhesive compositions, solvents for pellicle polymers, index matching fluids and the like. Of particular note is the suitability thereof in the emerging field of immersion photolithography at 193 nm exposure wavelength, wherein at least the target surface is partially or wholly immersed, preferably wholly immersed, in a medium of high transparency and higher refractive index than air or other gaseous atmospheres.

The term "F/H ratio" is employed to characterize the polycyclic fluoroalkanes desirable for use according to the present invention. The F/H ratio is determined by dividing the number of carbon-fluorine bonds by the number of carbon-hydrogen bonds. Polycyclic fluoroalkanes suitable for use in the processes and devices the present invention desirably have a F/H ratio greater than zero.

The terms "imaging," "imaging applications," "imagewise", as used herein, refer to formation of an image on a substrate by a photoactivated process comprising providing a light source emitting light in the wavelength range from about 190 to about 260 nm, preferably 193 nm or 248 nm the wavelength of emission of respectively an ArF-excimer laser and KrF excimer laser, illuminating at least a portion of a surface by the emitted light, and disposing a polycyclic fluoroalkane suitable for use herein between the light source and the surface such that at least a portion of the emitted light illuminating the surface is caused to be transmitted through the polycyclic fluoroalkane. There is no limitation on the shape of the image formed, and the image can include a completely masked and/or a completely unmasked surface. The terms "light" and "radiation" are used herein interchangeably to refer to non-ionizing electromagnetic radiation, in the wavelength range from 190-260 nanometers, most particularly at 193 and 248 nm, and are not intended to include ionizing radiation.

Unless otherwise stated, concentrations expressed herein as parts per million (ppm) refer to parts per million by weight on the basis of the total weight of the composition referred to.

When an amount, concentration, or other value or parameter is recited herein as either a range, preferred range or a list of upper preferable values and lower preferable values, the recited amount, concentration, or other value or parameter is intended to include all ranges formed from any pair of any upper range limit or preferred value and any lower range limit or preferred value, regardless of whether such ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

The term "heart cut" is used herein in reference to a fractional distillation, to refer to that portion of a condensate that is collected when the temperature of the condensate has reached a plateau.

The term "oxygen-minimized" is used herein to refer to the atmosphere within which a polycyclic fluoroalkane is handled and maintained. The term "oxygen-minimized", as used herein, means that steps are taken to reduce the contamination by atmospheric oxygen of the suitable polycyclic fluoroalkane. Dissolved oxygen is undesirable during storage because slow oxidation can generate chromophores that absorb light at 193 nm. Moreover, oxygen is undesirable because 193 nm light can interact with oxygen to create ozone.

The terms "suitable polycyclic fluoroalkane" and "preferred polycyclic fluoroalkane" are used herein to refer to polycyclic fluoroalkanes having an F/H ratio of 0.5 or less, but greater than zero, a refractive index of 1.50 or greater, and an absorbance at 193 nm of 2.0 or less cm$^{-1}$. The polycyclic fluoroalkanes thus characterized are highly suitable for use in immersion lithography in the VUV, and therefore may be referred to herein as "suitable polycyclic fluoroalkanes."

A suitable polycyclic fluoroalkane exhibits transparency in the VUV, high photochemical stability, and inherently high refractive index. It is known that the addition of fluorine to a hydrocarbon often results in the reduction of refractive index. It is further known that many fluorinated materials exhibit excellent transparency in the infrared, but not the vacuum ultraviolet. It is also known that increasing the carbon to hydrogen ratio in hydrocarbons, typically by employing cyclic structures, has the effect of increasing refractive index, although normally at some cost in transparency. However, unsaturated or functional group containing cyclic structures are generally not well suited for use in the vacuum ultraviolet.

The inventors have found surprisingly that a balance of desirable properties for VUV immersion photolithography applications is achieved by employing polycyclic fluoroalkanes having an F/H ratio of less than 0.5—that is, by employing saturated polycyclic hydrocarbons in which on a mole-% basis, only about one third or fewer of the hydrogens are replaced by fluorines.

The polycyclic fluoroalkanes preferred for use in the present invention can be represented by the structure

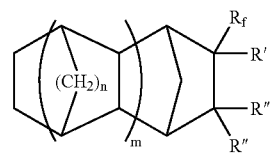

I where $R_f$ is a fluorinated alkyl radical of 1-10 carbons that can be linear, branched, or cyclic; R':is H, F, an alkyl radical, including a fluorinated alkyl radical, of 1-6 carbons that can be linear, branched, or cyclic; each R" is independently H or F, n=0 or 1, and m=1 or 2 with the proviso that m is not 2 when n=0. Preferably, $R_f$ is fluorinated cyclic alkyl radical or trifluoromethyl; more preferably $R_f$ is trifluoromethyl.

Preferably, R' is H, F or trifluoromethyl.

Suitable for the practice of the present invention are polycyclic fluoroalkanes, including mixtures thereof, represented by structure I, having an F/H ratio of 0.5 or less, preferably 0.3 or less. The transparency and photochemical stability of the polycyclic fluoroalkanes make them suitable for use in immersion photolithography in the vacuum ultraviolet/deep ultraviolet (VUV/DUV) region of the electromagnetic spectrum.

Preparation of a precursor olefinic structure, wherein $R_f$, R', and R" are as described hereinabove, can be accomplished by the well-known Diels-Alder reaction of a fluorinated olefin with a diene. The reaction can advantageously be performed at a temperature of about 200° C. for about 48 hours, according to the methods described in McBee et al. *J. Amer. Chem Soc.* 77 pp 915-917 (1954).

Polycyclic fluoroalkanes preferred for use according to the present invention can be prepared from the olefinic precursor represented by structure II by hydrogenation of the olefinic double bond in a sealed vessel under a gradually increased pressure of hydrogen from 50 psig to 200 psig at about 20-30° C., then gradual heating to 150° C. and pressure increase to 600 psig.

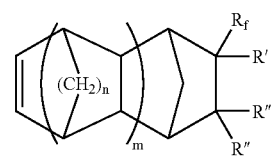

II

Certain embodiments of the polycyclic fluoroalkanes wherein m=2 may be solid. When the polycyclic fluoroalkane is a solid, it can be used in immersion lithography by dissolving it in one or more UV transparent materials such as 2,3-dihydroperfluoropentane, 1,1,1,3,3,3-hexafluorobutane, or common hydrocarbon solvents such as cyclohexane.

The present invention provides a process comprising providing a light source emitting ultraviolet light in the wavelength range of about 190 to about 260 nm, imagewise illuminating at least a portion of a target surface by a path of the emitted light, and disposing in at least a portion of the path between the light source and the target surface a polycyclic fluoroalkane such that at least a portion of the emitted light illuminating the target surface is transmitted through the polycyclic fluoroalkane, the polycyclic fluralkane having an F/H ratio of 0.5 or less but greater than zero, a refractive index of 1.50 or greater, and an absorbance at 193 nm of 2.0 cm$^{-1}$ or less.

The present invention further provides an apparatus comprising a light source capable of emitting light in the wavelength range of about 190 to about 260 nm, a target surface disposed so that upon activation of the light source at least a portion of the target surface is imagewise illuminated by the light emitted from the light source, and a polycyclic fluoroalkane disposed between the light source and the target surface such that at least a portion of the emitted light illuminating the target surface is transmitted through the polycyclic fluoroalkane; the polycyclic fluralkane having an F/H ratio of 0.5 or less but greater than zero, a refractive index of 1.50 or greater, and an absorbance at 193 nm of 2.0 cm$^{-1}$ or less.

In some preferred embodiments, the light source is a laser that emits light at 193 or 248 nm. In some highly preferred embodiments, the light source is an ArF excimer laser emitting light at 193 nm. Other suitable light sources include lamps such as gas discharge lamps of deuterium, xenon, or halogen, laser plasma light sources, and frequency shifted lasers, such as frequency doubled or tripled laser light sources.

Preferably the target surface is a photoresist surface. More preferably the photoresist surface resides on a silicon wafer. Preferably, the illuminating comprises imagewise exposure of the preferred photoresist surface. Most preferably the photoresist surface is immersed in the polycyclic fluoroalkane during the illiminating.

In some embodiments, depending in part upon the nature of the photoresist or other surface material, the resist partially or completely dissolves in, or is swollen by or otherwise damaged by the polycyclic fluoroalkane. A protective topcoat can be applied to the resist. The topcoat is preferably optically uniform, transparent to 193 and 248 nm light, adherent to the resist, insoluble in the immersion fluid, and can be deposited and later removed in the process of immersion photolithography that leaves the underlying resist and the latent image in the resist (which is present in the resist after exposure and before development of the photoresist) undamaged.

Suitable topcoats include highly fluorinated polymers that are soluble in highly fluorinated solvents. Highly fluorinated solvents are desirable in preparing a topcoat because they do not disturb most photoresist compositions. Suitable topcoat polymers include the homopolymer of perfluorobutenylvinyl ether {1,1,2,3,3,4,4-heptafluoro-4-[(trifluoroethenyl)oxy]-1-butene} or amorphous soluble copolymers of two or more monomers such as tetrafluoroethylene (TFE), hexafluoropropylene (HFP), perfluorodimethyldioxole [4,5-difluoro-2,2-bis(trifluoromethyl)-1,3-dioxiole], and perfluoro alkyl vinyl ethers such as perfluoromethylvinyl ether and perfluoropropylvinylether. The recited copolymers may also include small amounts of termonomers including vinylidene fluoride, vinyl fluoride, trifluoroethylene, 3,3,3-trifluoropropene, 3,3,3,2-tetrafluoropropene, and hexafluoroisobutylene [3,3,3-trifluoro-2-(trifluoromethyl)propene], but not so much of these monomers that the polymers are no longer soluble in the desired highly fluorinated solvents. Preferred fluorinated solvents include Fluorinert™ FC-75, Fluorinert™ FC-40, Performance Fluid™ PF-5080, perfluorobutyltetrahydrofuran, perfluorotributylamine, perfluorooctane, perfluoroalkanes, and perfluorodecahydronapthalene. Preferred topcoat polymers are Teflon® TFE AF, available from the DuPont Company, Wilmington Del., Cytop™, 40-60:60:40 poly (hexafluoropropylene:tetrafluoroethylene), and poly (perfluorodimethyldioxole:perfluoropropylvinyl ether).

The thus prepared polycyclic fluoroalkane is treated so that oxygen concentration preferably does not exceed 2 parts per million by weight (ppm), and treated to remove trace organic contaminants. The so-treated polycyclic fluoroalkane desirably exhibits absorbance 2.0/cm or less, preferably from 0.1 to 1 cm$^{-1}$, at 193 nm. In preferred embodiments of, the oxygen concentration of the polycyclic fluoroalkane after treatment does not exceed 1 ppm.

$E_0$ (clearing dose) and $E_1$ (exposure dose) are employed in the integrated circuit industry. The low absorption of the polycyclic fluoroalkanes results in desirably low levels of $E_0$ and $E_1$, which in turn can translate into higher productivity at fixed laser fluence. In this sense the lower optical absorbance reduces the cost of the lithography, while at the same time the high refractive indices of the polycyclic fluoroalkanes allow the further reduction of printed feature sizes. The term "$E_0$" (clearing dose) is a term of art that refers to the open field incident optical energy exposure at which the photoresist is completely removed after exposure and subsequent aqueous base development. The term "$E_1$" (exposure dose) is a term of art that refers to the incident optical energy exposure at which the photoresist has patterned features of the desired size, as produced from the pattern of the photomasks, after exposure and subsequent aqueous base development.

The inventors have found that the VUV absorbance of as-prepared polycyclic fluoroalkanes can be reduced significantly with further treatment. Outlined herein are suitable methods for purifying the as-prepared polycyclic fluoroalkane hereof that have been found to be useful. As will be understood by one skilled in the art, the use of all of the methods of purification disclosed herein may not be necessary, but frequently some method or combination of methods will be desirably used to effect the desired degree of absorbance.

Certain organic impurities, such as olefins, substituted cycloalkanes, branched alkanes, oxidation products such as peroxides and ketones, may be present. Some organic impurities are orders of magnitude more absorbing than other organic impurities. So, for example, a suitable polycyclic fluoroalkane contaminated by a percent or two of cyclobutane, which is quite transparent though of high vapor pressure and low refractive index, may be suitable for use in the processes disclosed herein. On the other hand, it may be desirable that the concentration of more highly absorbing contaminants, such as olefins and carbonyls, be on the order of 1 ppm or even less.

Highly absorbing contaminants can be removed from the polycyclic fluoroalkane by such methods as fractional distillation, sparging, freeze-thaw cycling, zone refining, and treatment with adsorbents such as silica, molecular sieves of various pore sizes, carbon, silica gel, alumina, or mixtures thereof.

One of skill in the art will appreciate that the absorbance by the polycyclic fluoroalkanes is preferably as low as possible, provided the oxygen concentration is desirably low. In a preferred embodiment, the polycyclic fluoroalkane exhibits absorbance at 193 nm in the range of 0.1 to 1.0 cm$^{-1}$. It will be appreciated by one of skill in the art that at purity levels required to achieve this result, the most sensitive measurement of contamination is the spectroscopic absorption itself. In other words the best way to tell that the most important impurities have been removed is to measure the absorbance. Absorbance below 1 cm$^{-1}$ is by far the most sensitive available indicator of purity in regard to trace amounts of absorbers. Absorbance by the polycyclic fluoroalkanes suitable for use according to the present invention is lower by about 90% or more than that of conventional materials. Thus the term "absorbance" refers to two related phenomena. On the one hand, the term "absorbance" refers to the absorbance of the polycyclic fluoroalkanes in actual use in the processes disclosed herein, which can be affected by external influences such as the solubility of a photoresist, as discussed hereinabove. On the other hand, "absorbance" also refers to the analytical spectroscopic methods employed to determine absorbance under laboratory conditions. The latter is a highly desirable method for evaluating the concentration of contaminating adsorbents in compositions of high purity.

It has been found in the practice of the present invention that silica gel is a highly effective adsorbent for very small amounts of organic contamination present in the polycyclic fluoroalkanes. Large improvements in transparency have been observed when a polycyclic fluoroalkane has been treated with silica gel. It has further been found that sometimes a sulfuric acid wash step can be omitted, and that the silica gel treatment will suffice to prepare a polycyclic fluoroalkane with absorbance 2 cm$^{-1}$ or less. While it is not intended that the present invention be bound by any particular theory, it is expected that silica gel treatment may be sufficient when the conditions of hydrogenation are precisely set to drive conversion to the point where the level of residual olefin is below detectability under the experimental conditions employed herein. However, the sulfuric acid wash step is still desirable to ensure that the olefin concentration is as low as possible.

It may be desirable to first subject the as-prepared polycyclic fluoroalkane to fractional distillation in the cleanest possible, grease-free distillation apparatus. The heart cut of the distillate thus produced is then mixed in the liquid state with a mixture of adsorbents, which can include, for example, silica gel, 3A, and 5A zeolite molecular sieves, alumina, and/or activated carbon. All subsequent handling of the thus purified polycyclic fluoroalkane is then performed in an oxygen-minimized atmosphere, preferably an inert gas atmosphere, most preferably a helium or nitrogen atmosphere. This includes the use thereof in immersion photolithography, which is preferably performed in an oxygen-minimized atmosphere.

Silica gel and zeolite adsorbents are most effective if activated, preferably by heating while purging with a dry gas flow. It is preferable that adsorbent activation be done immediately prior to use. Activation can be achieved by heating to about 200 to 500° C. under a flow of dry, pure air, nitrogen, or helium for several hours. Air at 500° C. has the advantage of burning most residual organic contaminants off an adsorbent such as a silica gel or a zeolite. The gas flow can be continued as the system cools down to a temperature in the range of room temperature to 100° C. In an alternative procedure the gas flow is stopped and the system sealed off. In another alternative procedure, the gas flow is stopped and the system evacuated as the adsorbent cools to a temperature in the range of room temperature to 100° C. The advantage of stopping the gas flow while the adsorbent is at 500° C is that this minimizes recontamination from any adventitious impurities in the gas as the adsorbent cools down.

A preferred method of activating the silica gel and zeolite adsorbents is the following. A Hastelloy® tube in a clamshell furnace is loaded with adsorbent and then heated under an air flow for two hours at 500° C. The air flow is stopped and the Hastelloy tube immediately sealed at both ends. Once the sealed Hastelloy® tube has cooled to room temperature, it is transferred to a N$_2$ glove bag where the tube is opened and the adsorbent added to a bottle containing suitable polycyclic fluoroalkane liquid that is to be purified. Although the ratio of adsorbent to liquid can be varied without limit, it has been found satisfactory to employ one volume of adsorbent for every 1 to 20 volumes of liquid. The amount of adsorbent required depends upon the extent of contamination in the as-received liquid. It is therefore well advised to employ some excess to insure maximum effectiveness in removal of contaminants.

It is highly desirable that any distillation process employed in the purification of the polycyclic fluoroalkanes be performed in the cleanest, least contaminated distillation apparatus possible. It is particularly desirable to exclude oxygen and any adventitious or systemic organic contaminants. It is found in the practice of the invention that employment of grease, including fluorinated greases, such as are commonly employed in distillation and vacuum systems to provide improved sealing and easier part removal, can contaminate the distillate sufficiently to actually degrade (i.e., increase) the absorbance by the polycyclic fluroalkane. It is therefore highly preferable to perform the distillation in a "grease-free" distillation system. "Grease-free", as used herein, means that no grease is employed when assembling the cleaned parts of the system. One of skill in the art will appreciate that the term "grease-free" does not mean that the invention is necessarily inoperable should there be some small amount of grease contamination somewhere in the system. To the extent that a system can be cleaned of all grease contamination, the absorbance is advantageously reduced, but "grease-free" is not intended to require the complete absence of any grease in no matter how small a concentration.

There are numerous uses for the highly transparent polycyclic fluoroalkanes in the wavelength range of 190 to 260 nm. Examples of applications include optical couplants, optical cements, optical elements such as liquid lenses, index-matching optical inspection media for semiconductor wafers and devices, and immersion fluids, especially for 193 and 248 nm photolithography.

Sparging is a suitable method for removing contaminants from the polycyclic fluoroalkanes, particularly for the removal of oxygen. One method for sparging that can be used is as follows. A glove box is supplied with dry, low-oxygen-content nitrogen, such as 99.998% or less oxygen, as sold as a cylinder gas by Matheson, or supplied by the boil-off of liquid nitrogen. A liquid aliquot of about 10 ml is placed in a 20 ml glass scintillation vial. The vial is transferred into the nitrogen purged dry box. The vial is secured flat on the work surface in the box, the plastic cap is removed from the vial, a disposable glass pipette lowered into the solvent and then nitrogen delivered via the pipette from the same dry, low-oxygen source as the glove box. Flow rate is adjusted to maintain vigorous bubbling of solvent short of causing the solvent to splash out of the vial. Vigorous sparging is continued for 30-60 seconds, long enough to significantly decrease oxygen content and possibly water content without significant loss of the polycyclic fluoroalkane to evaporation.

Because available instrumentation has a sensitivity limit of about 1 ppm of oxygen the actual oxygen concentration in a specimen may be considerably lower than 1 ppm. Henry's Law can be employed to estimate the oxygen concentration, using Henry's Law constants available in the literature. Based upon such estimates, it is estimated that the actual oxygen concentration in the polycyclic fluoroalkanes, when handled in an oxygen-minimized atmosphere, may be less than 100 ppb (parts per billion).

An alternative method for purifying the polycyclic fluoroalkanes for use in the instant process is bulb-to-bulb distillation through a bed of 3 A molecular sieves. For example, two flasks are connected by a tube containing 3 A molecular sieves preheated as described above. One of the flasks is then partially filled with the liquid that is to be purified and the system resealed. The liquid is subjected to three freeze/thaw cycles to remove dissolved oxygen. The system is then thoroughly evacuated after refreezing the liquid with liquid nitrogen. The system is sealed under vacuum and the liquid nitrogen cooling bath transferred from the flask containing the liquid to the empty flask. As the liquid warms towards room temperature it distills through the bed of 3A molecular sieves to the chilled flask. Once distillation is complete the vacuum is relieved with oxygen free nitrogen, the purified liquid allowed to warm to room temperature, and the flask then valved off for subsequent use.

From the standpoint of practical utility, it is highly desirable to remove contaminating species that exhibit photochemical reactivity. Such species not only tend to be strongly absorbing in the wavelength region from 190 to 260 nm, but also can undergo photo-induced reactions, often resulting in bubble formation and darkening. Extraction of any one photochemically active species is beneficial whether or not any other photochemically active species present is extracted.

In a process according to the present invention, a surface is imagewise exposed to electromagnetic radiation in the wavelength range of 190 -260 nm, preferably at 193 nm and 248 nm. In one embodiment of the present invention, the entirety of a surface is illuminated by the emitted light. Preferably the surface is exposed in a pattern, leaving some portions exposed and others not. In some preferred embodiments the surface is fully immersed in the polycyclic fluoroalkane during illumination.

The polycyclic fluoroalkanes are desirably employed in immersion photolithography in the wavelength range from 190 to 260 nm, preferably at 193 nm or 248 nm, most preferably at 193 nm. At least the photoresist target surface is immersed in the polycyclic fluoroalkane hereof. A liquid suitable for use in immersion photolithography is preferably transparent enough to allow a working distance of at least 10's of micrometers and have radiation durability at 193 nm. The combination of transparency, refractive index, and radiation durability of the polycyclic fluoroalkanes makes them particularly well suited for immersion photolithography at 193 nm exposure wavelength.

It is also highly preferred that the suitable polycyclic fluoroalkanes be chemically and physically compatible with other materials with which it is used. In immersion photolithography at 193 nm exposure wavelength, the immersion fluid is in contact with a photoresist polymer. It is highly desirable that the immersion fluid not dissolve or swell the photoresist, not interfere with latent image formation in the photoresist under 193 nm exposure, and not interfere with subsequent development of the photoimaged photoresist in a developer solution. In addition the immersion fluid preferably has a low enough volatility that it does not require a pressure vessel for containment and is can be removed for reprocessing prior to post exposure baking and development.

To prevent the immersion fluid from damaging the resist, a topcoat can be applied, as described hereinabove. A suitable topcoat is preferably substantially transparent in the wavelength range of 190-260 nm, particularly at 193 and 248 nm, photochemically inert in the desired wavelength range, substantially insoluble in the polycyclic fluoroalkane, and soluble in solvents in which the photoresist is insoluble. In a typical procedure, the substrate is spin-coated with a photoresist, a selected top-coat polymer is dissolved in a suitable solvent, the photoresist-coated substrate is spin-coated with a topcoat, and the spin-coated substrate is contacted with the polycyclic fluoroalkane. Photoimaging can then be carried out, the topcoat removed by dissolution in a solvent that does not dissolve or swell the photoresist, and the photoresist developed according to methods known to those skilled in the art Three examples of embodiments contemplated within the framework of immersion photolithography at 193 and 248 nm exposure wavelengths are contact, proximity, and projection immersion photolithography. In projection immersion photolithography, the index of refraction of the liquid has the effect of providing an effective reduction in the wavelength of the incident laser light. The effective reduction of the exposure wavelength results in improved image resolution and smaller attainable features.

In contact and proximity immersion photolithography, for example at 193 and 248 nm exposure wavelengths, the wavelength of the incident laser light in the fluid is the same as for projection immersion photolithography, but the feature sizes imaged are dictated by the contact or proximity mask used. In contact or proximity immersion photolithography the primary purpose of the polycyclic fluoroalkane is to protect the imaged surface, for example, from particulate or dust contamination from the environment. Additionally, contact and proximity immersion photolithography are useful screening methods for determining the usefulness of a candidate liquid for the more complex and expensive but more preferred projection method.

In one embodiment 193 nm radiation from an ArF excimer laser, is transmitted through a photomask, typically comprising a chrome metal circuit diagram patterned on glass, forming an image of the circuit pattern on a photoresist. Numerous materials for use as photoresists are well known in the art and are in widespread commercial use. All such materials are suitable for processes according to the present invention so long as they are sensitive to 193 nm light and are substantially insoluble in the polycyclic fluoroalkane or can be protected from dissolution by a topcoat. Suitable photoresist compositions are described in *Introduction to Microlithography*, Second Edition by L. F. Thompson, C. G. Willson, and M. J. Bowden, American Chemical Society, Washington, D.C., 1994. Examples of suitable photoresists include the 193 nm Epic Resists from Rohm and Haas Electronic Materials, (Marlborough, Mass.), or other resists from companies such as TOK (OHKA AMERICA, INC. Headquarters/Hillsboro, Oreg. or AZ Electronic Materials, Somerville, N.J.

Both positive-working photoresists, such as Rohm and Haas's Epic 2200, and negative-working photoresists such as Rohm and Haas's UVN30 are suitable for use in the immersion photolithography process. A positive-working photoresist is one wherein the regions exposed to light are rendered soluble in the developer, while the unexposed regions are insoluble therein. A negative-working photoresist is one wherein the regions exposed to light are rendered insoluble in the developer while the regions unexposed to light are soluble therein.

A photoresist, when imagewise exposed to light, forms what is called a latent image. In one embodiment of a process of the invention, a chemically amplified, positive resist containing a photoacid generator (PAG) is employed. The photoresist layer comprising the latent image is subject to a post exposure bake (PEB) step for typically 60 seconds at temperatures between 90 and 140° C. in air. After this PEB step, the photoresist coated wafer is then put into an aqueous base developer, such as a 0.26 Normal TMAH developer, whereby the exposed regions of the polymer film are developed away, and the patterned photoresist is observed.

While there is no particular limitation on the thickness of the photoresist layer, typically the photoresist coating is from about 150 nm to 200 nm in thickness on a silicon wafer substrate. The desired thickness is determined by the desired minimum feature sizes to be printed. For the purpose of illustration of this concept, but in no way limiting on the scope of application the invention, using an aspect ratio of 3-4, a typical value in the semiconductor art, if the desired features are 65 nm in width, the film thickness should be about 195 nm. In general, the thicker the photoresist layer, the better the resistance to dry-etch processes in subsequent processing of the patterned photoresist layer.

The presence of a topcoat does not materially alter the operability of immersion photolithography. Suitable topcoats include, but are not limited to, highly transparent fluoropolymers, which are soluble in fluorinated solvents, which fluorinated solvents in turn are not solvents for the photoresist polymers. Particularly preferred are amorphous perfluoropolymers such as Teflon® TFE AF, available from DuPont. In a typical application, an amorphous fluoropolymer is dissolved to a concentration of 1-5% by weight in a perfluorinated solvent such as Fluorinert™ FC-75. The solution so formed is spin-coated onto a photoresist coated substrate to form a topcoat film of 50-300 nm thickness.

One of skill in the art will appreciate that the source of the 193 nm radiation, or radiation in the wavelength range of 190-260 nm, is not critical. ArF excimer lasers are convenient, controllable, high intensity sources of 193 nm radiation and are therefore preferred.

Figure 2:
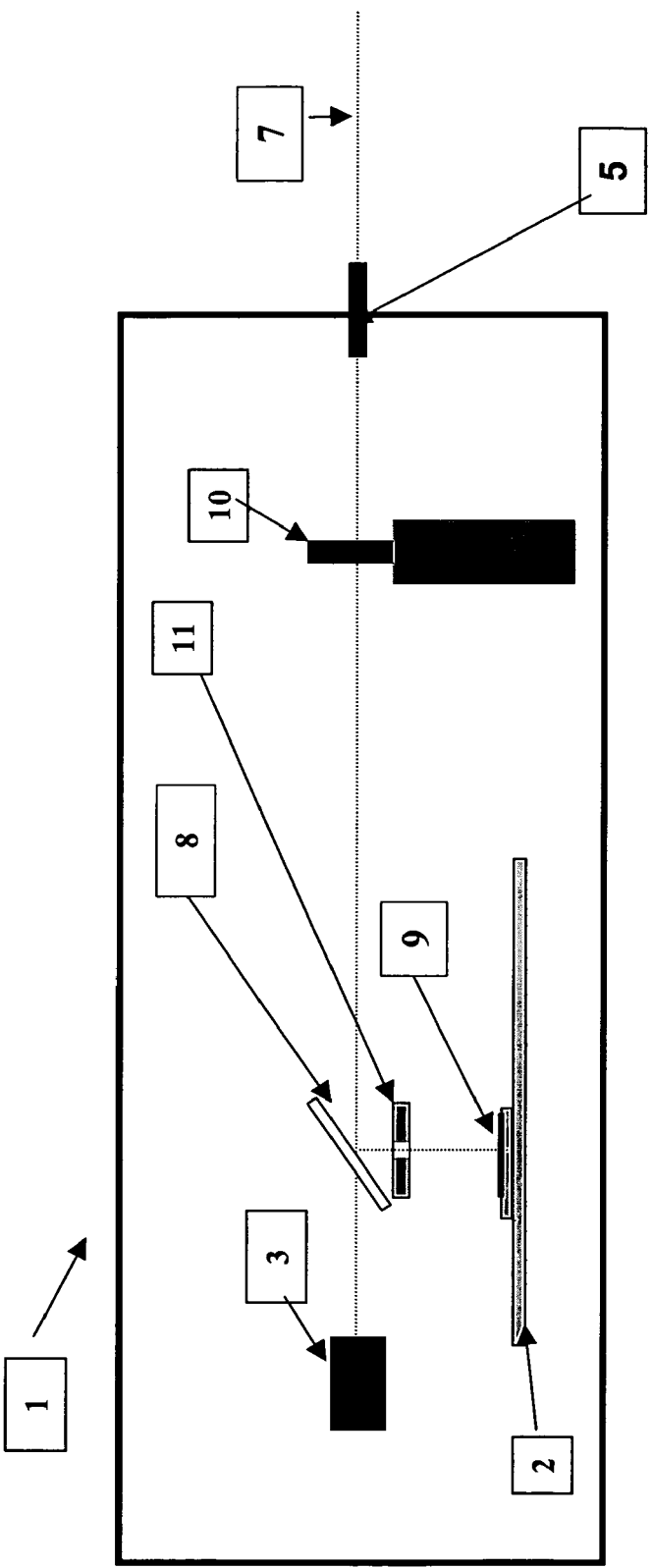
FIG. 2 shows schematically more detail of the optical apparatus for immersion contact lithography as shown in FIG. 1.
Figure 3:
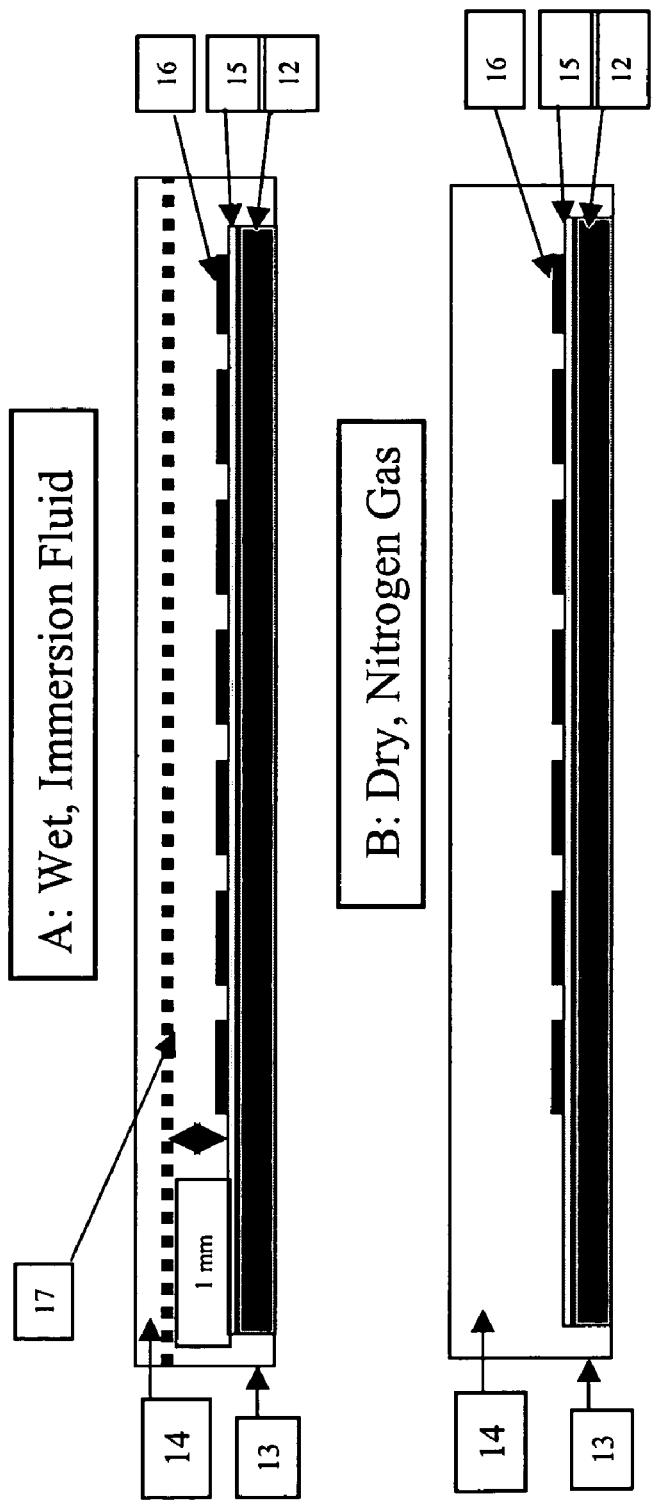
FIG. 3 shows schematically the wafer exposure stage for immersion contact lithography.

One embodiment of a photolithographic process according to the invention is depicted in FIGS. 1, 2, and 3. FIG. 1 shows a complete system, parts of which are advantageously disposed in a nitrogen dry box, 1, with an optical table, 2, mounted inside the dry box to accommodate optical components and a translating sample stage. A Scientech power meter, 3, is used to read the energy of the 193 nm laser light pulses emitted by an ArF excimer laser, 4. In the particular embodiment depicted in FIG. 1, the photolithographic exposure chamber is a low oxygen/low moisture nitrogen flushed dry-box (Nexus Dry Box, Vacuum Atmospheres Co., Hawthorne Calif. 90250-6896) adapted for use in the apparatus therein depicted. The 193 and 248 nm laser light is introduced into the dry box through an access port 5. A dry box control panel mounted internal oxygen and moisture analyzer, 6, is used to monitor the oxygen content in the dry box, and to indicate when oxygen concentration has decreased to acceptable levels after introduction of samples. Upon introduction into the dry box chamber, the laser beam 7 is reflected downwards by a fused silica beam splitter, 8, through an aperture plate with a 0.5×0.5 centimeter opening, 11, to the photoresist coated silicon wafer, 9. The photoresist coated wafer is contained in a machined aluminum wafer holder and immersed to a depth of about 1 mm in the polycyclic fluoroalkane hereof. The whole plate can be translated under the laser beam to allow sequential exposures of different portions of the wafer, with differing exposure doses.

FIG. 2 shows more details of the optical exposure system of FIG. 1. The pulsed laser beam, 7, from the Excimer laser 4 enters the dry box, 1, at the access port, 5, goes through a manually operated shutter, 10, and is then incident on a fused silica beam splitter 8, that reflects a small portion of the laser energy down through an aperture plate with a 0.5×0.5 centimeter opening, 11, towards the photoresist coated silicon wafer 9 mounted on a translator that allows the sample to be translated under the laser beam. The majority of the laser beam continues through the beam splitter 8 and is then incident on a power meter head, 3.

Figure 4:
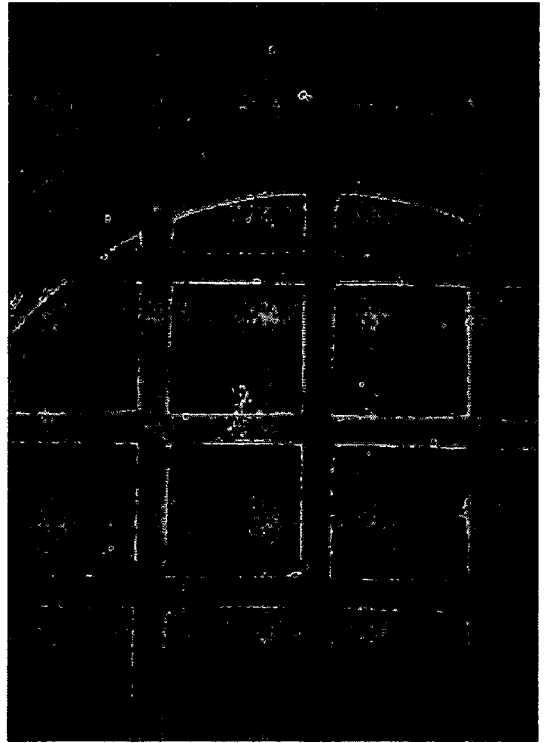
FIG. 4 shows a photograph of a photoresist image prepared using a polycyclic fluoroalkane according to one embodiment of the invention.
Figure 5:
FIG. 5 shows a photograph of a:photoresist image prepared without the use of an immersion fluid.

FIG. 3 shows the wafer exposure stage, where the laser light, from the excimer laser hits the silicon wafer 12, in the machined aluminum plate 13 that moves under the laser beam along the translation stage on the optical table 2 of FIG. 1, so as to permit the sequential exposures, at various exposure doses. 14 is the N2 environment of the N2 dry box. 12 is the silicon wafer, which has been coated with a photosensitive photoresist polymer 15 as discussed in more detail below. Not shown is the topcoat layer as hereinabove discussed. Depicted in FIG. 4 is an embodiment of contact immersion photolithography at 193 nm exposure wavelength wherein a photomask 16 is placed on the surface of the photoresist polymer layer and the immersion fluid is introduced to cover the photoresist coated silicon wafer to a depth of approximately 1 mm 17. It has been found that when the photomask is small and light, as for example the metal grids used in the specific embodiments herein, it is convenient to introduce the immersion fluid first and then to position the photomasks in the fluid and on the surface of the photoresist coated silicon wafer. FIG. 5 depicts the same set-up but without the immersion fluid; FIG. 5 is not an embodiment of the present invention.

In another embodiment of the present invention, the photomask can be offset from the surface of the photoresist by a distance of about 10 µm. In a preferred embodiment of the present invention, in so called projection photolithography at 193 nm exposure wavelength, the photomask is disposed at some convenient location in the optical path, and the image is projected via a lens system, typically known as a projection lens, onto the photoresist. The projection system provides the highest resolution of the various embodiments of the present invention.

In a preferred embodiment of the process of the invention, projection photolithography at 193 nm exposure wavelength is employed. In this embodiment the output element of the projection lens—that end of the lens system closest to the photoresist surface—is disposed within the polycyclic fluoroalkane at a distance of about 0.5-5 mm from the photoresist surface, which is also immersed in the polycyclic fluoroalkane, the photoresist surface optionally having a topcoat 50-200 nm thick. In this embodiment the effective wavelength of the incident light is decreased, thereby increasing image resolution over that which can be attained in a gaseous atmosphere.

Thickness of the polycyclic fluoroalkane layer is determined by the details of the imaging system being developed or used. For example, in contact photolithography at 193 nm exposure wavelength a suitable thickness of the polycyclic fluoroalkane immersion layer is 1 mm. A 1 mm thickness may also be suitable for scanning or stepping the wafer under a projection lens, while maintaining sufficient distance between the output element of the projection lens and the wafer. One of skill in the art will appreciate that as the immersion fluid thickness is increased attenuation of the light will also increase, but tolerances in regard to the mechanics of stepping and scanning may become easier. Thinner immersion liquid layers may permit higher light exposure levels but the tolerances required for achieving scanning and/or stepping the wafer at high speed and with high accuracy may become excessively demanding.

The polycyclic fluoroalkane hereof provides flexibility in system design, reducing the need to trade-off between the thickness of the immersion layer and mechanical design.

In a complete semiconductor manufacturing process, the photolithographic imaging and development of a photoresist layer are performed a number of times in sequence, with a series of photomask patterns, and with various etch and deposition processes done between the sequential photolithographic steps.

In some embodiments, the polycyclic fluoroalkane having an F/H ratio of 0.5 or less is subject to repeated exposure to intense bursts of laser light, and is in contact with other surfaces that, however clean, may still contain some contamination. Both these effects may be deleterious over time to the absorbance of the polycyclic fluoroalkane. One example method for restoring the polycyclic fluoroalkane is to recycle it through adsorbents such as those recited hereinabove, preferably under inert gas. Recycling and regeneration of the polycyclic fluoroalkane can be accomplished batch-wise or continuously.

Figure 6:
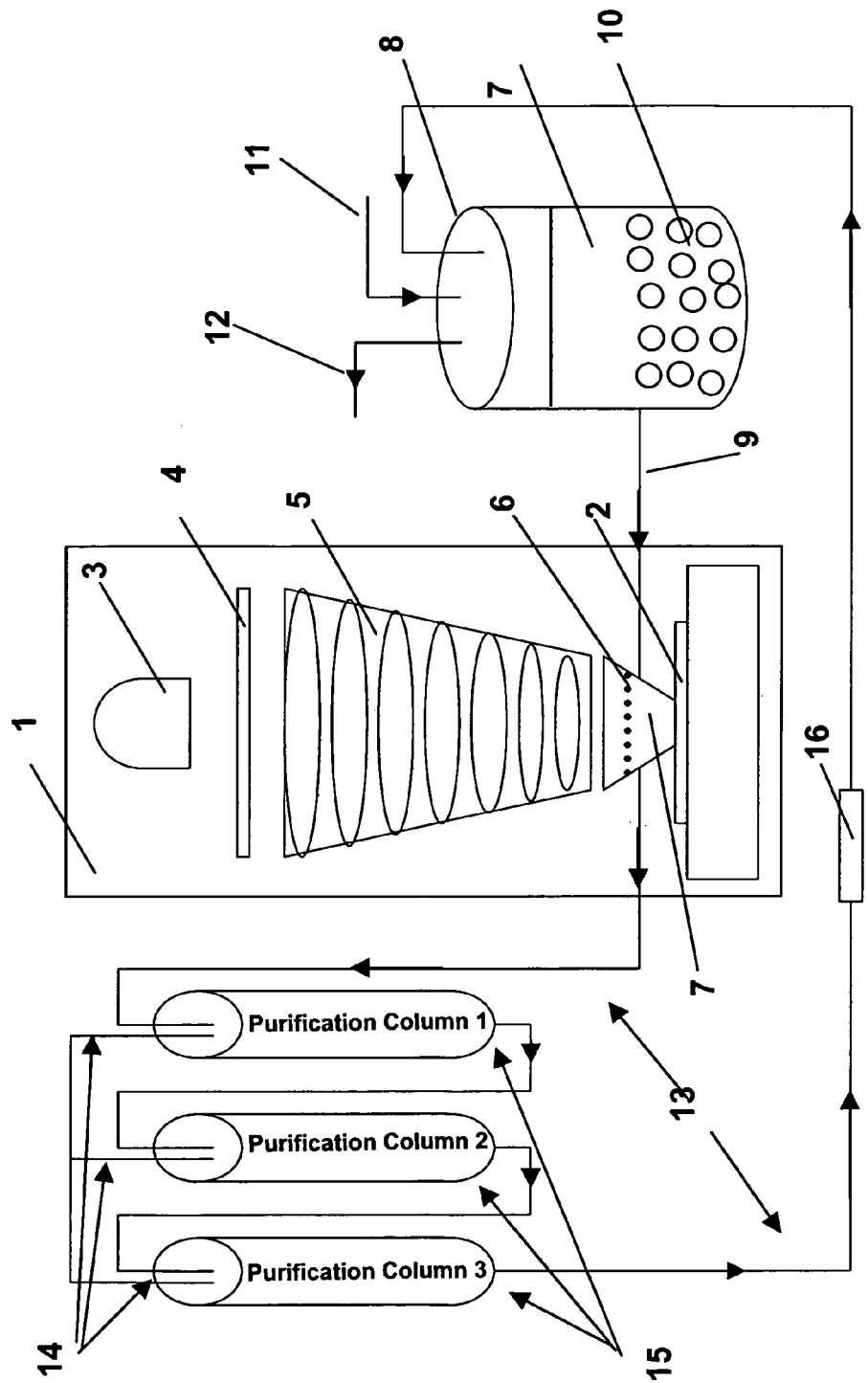
FIG. 6 shows one embodiment of a recycling system suitable for the practice of the present invention.

In some embodiments, a process further comprises using a closed-loop recycling system for continuously re-treating and re-introducing the polycyclic fluoroalkane. One embodiment of such a recycling system is shown in FIG. 6. Shown in FIG. 6 is an "optical stepper", also called an "optical scanner," 1, in which a photoresist disposed upon a silicon wafer, 2, is imaged. Light from a light source, e.g., 193 nm ArF Excimer Laser, which has been optically homogenized by the illuminator, 3, illuminates a photomask 4, and then the light goes through the projection lens 5 which typically has many individual lens element and reduces the image size by 4 or 5 times. At the bottom of the projection lens there is a "shower head," 6 which couples the last lens element of the projection lens, with the immersion fluid and the photoresist coated wafer, so that there are no interceding air gaps in the optical path of the light. The shower head is filled with the immersion fluid 7, for example the polycyclic fluoroalkane having an F/H ratio of 0.3 or less, and the immersion fluid contacts the last lens element of the projection lens and the photoresist coated silicon wafer 2 which will receive the photomask pattern. The photoresist coated silicon wafer may also contain a top coat layer which is above the photoresist layer, and may be used to separate the immersion fluid from the photoresist. The "shower head" is so named because it serves as the supply and the return of the flowing immersion fluid in the optical stepper, and captures the immersion fluid from flowing into undesirable locations in the optical stepper. In this embodiment, the immersion fluid 7 is fed continuously to the shower head 6, from a reservoir 8, via a transfer line 9, the reservoir containing adsorbent particles 10, such as activated silica gel, alumina, carbon, zeolites, or most preferably, a mixture thereof. The reservoir is continuously purged with inert gas via an input feed 11, and exhausted via an exhaust outlet, 12. In addition the reservoir may be actively sparged. The polycyclic fluoroalkane is fed continuously to the shower head, and removed continuously therefrom via a recycle line 13. The recycle line feeds the immersion fluid 7 to a series of three inert gas purged columns 14, 15, packed with adsorbents (the columns can also be actively sparged). Upon exiting the last column, the recycle stream passes through an on-line UV spectrometer 16 consisting of a light source and a detector, which preferably measures the absorbance at the lithographic wavelength, to monitor the optical absorbance of the reprocessed immersion fluid. The recycle stream is then fed directly back into the reservoir 9. The immersion fluid can be made to flow through the system, from the reservoir, through the shower head and through the purification columns by various means, for example by a pump such as a peristaltic pump (choosen to be made of non-contaminating materials) or alternately the immersion fluid can be made to flow under inert gas pressure, and with mass flow or fluid flow controllers.

The polycyclic fluoroalkanes can be employed in any number of ways in addition to as an immersion liquid in photolithography. Examples of other applications include those in which the suitable polycyclic fluoroalkane is disposed between a 193 or 248 nm light source and a target. The suitable polycyclic fluoroalkane can employed neat, as in liquid lenses, index matching fluid, and the like, or it can be an ingredient of a mixture or a diluent such as a solvent for polymers in spin-coating operations, a plasticizer in a polymeric film, or a solvent in an adhesive formulation.

In another embodiment, the polycyclic fluoroalkane can be used in optical inspection of patterned or unpatterned objects such as semiconductor wafers, where small size defects of varying optical properties are to be detected. The use of the polycyclic fluoroalkanes as immersion fluids for immersion inspection enables both higher resolution imaging in the inspection, and also reduces optical scattering from the topography of the sample, permitting the inspection of, for example, deep holes that may have defects, such as particulate debris present. In still further embodiments, the polycyclic fluoroalkanes are useful in the fabrication of sheets, layers, coatings, and films used in lenses, light guides, anti-reflective coatings and layers, windows, protective coatings, and glues suitable for use in 193 nm photolithography.

The polycyclic fluoroalkanes can also be used in elements in a compound lens designed to reduce chromatic aberrations. Heretofore, generally only $CaF_2$ and hydroxyl free silica have been viewed as having sufficient transparency at 193 nm to be used in transmissive focusing elements. It is also known, as disclosed in, for example, R. Kingslake, Academic Press, Inc., 1978, Lens Design Fundamentals, p. 77, that by using a second material of different refractive index and dispersion, an achromatic lens can be created.

The present invention is further described by, but not limited to, the following examples.

EXAMPLES

Optical Absorbance Measurements

The transmission based absorbance measurements were made using a Harrick Scientific Corp. (Harrick Scientific Corporation 88 Broadway Ossining, N.Y.) Demountable Liquid Cell model DLC-M13 The cell had a 8 mm aperture, which included (2) 13 mm diameter×2 mm thick $CaF_2$ windows, Viton® polymer o-ring seals, (2) Luer-Lok(R) fittings for loading sample, assorted Teflon® tetrafluoroethylene (TFE) spacer thicknesses from 6 um to 4000 um. The DLC-M13 was mounted in a variable angle spectroscopic ellipsometer manufactured by J. A. Woollam Co., Inc., Lincoln, Nebr., either a VUV-Vase® model VU-302 for measurements from the near IR to 145 nm, or a DUV-Vase® model V- for measurements from the near IR to 187 nm. the liquid specimen to be tested was held in a cell formed between parallel $CaF_2$ windows by insertion of a Teflon® TFE ring between the windows. Teflon® TFE rings of 6, 25, 100, 500, 920, 2200, 3000, 4000, 6000, and 10000 micrometers were machined for insertion into the Harrick cell in place of the single thickness ring provided by the manufacturer in order to provide multiple optical path lengths through different aliquots of the same sample. While charging the cell, care was taken to avoid bubbles in the 8 mm diameter window aperture.

The nitrogen atmosphere in which the specimens were handled in the examples, unless otherwise stated, was produced from boiled off liquid nitrogen and is estimated to have had an oxygen concentration of 3-5 ppm.

The optical absorbance, A ($cm^{-1}$), is defined for purposes herein as the base 10 logarithm of the ratio of the transmission of the $CaF_2$ windows at the test wavelength divided by the transmission at that wavelength of the test sample (windows plus experimental specimen) divided by the thickness (t) of the test specimen To eliminate the effect of multiple reflections in the case of the liquid samples employed herein, absorbance was determined using the relative change in the transmission of multiple liquid filled Harrick cells with differing cell spacer thicknesses. As many as 5 different optical path lengths were employed for a single determination of absorbance.

Harrick Cell Cleaning and Assembly Procedure

Prior to use, and after each sample run, the Harrick cell was flushed with Vertrel® XF as a cleaning solvent (Miller-Stephenson Chemical Co., Danbury, Conn.). A clean 1 ml Glass syringe (Becton Dickinson, Franklin Lakes N.J.) with a female Luer-Lock fitting was filled with Vertrel XF and then attached to the male Luer-Lock fitting on the Harrick cell, at which point the Vertrel® XF was flushed through the cell. The cell was then blown dry using "house nitrogen" (produced from the boil off of liquid nitrogen and which has fewer than 3 ppm of water and 5 ppm of oxygen). The cell was then disassembled in reverse order. The $CaF_2$ windows and the selected thickness Teflon® TFE spacers were placed into a 20 ml vial containing Vertrel® XF, the vials were capped and then put into an ultrasonic bath for, 30-60 seconds. The $CaF_2$ windows and spacers were removed form the cleaning vial, given a final rub with a Q-tip moistened with Vertrel® XF then dried with air from a puffer bulb. The cell was then assembled vertically stacking the components and hand tightening the compression nut onto the cell. The cleaning and assembly was done in air.

Loading the Harrick Cell in Air (Lab Hood)

To the thus prepared cell, approximately 0.5 ml of the sample liquid was transferred from its container using a clean 1 ml BD glass syringe, the syringe was then attached into the cell and the cell was filled until the liquid meniscus was visible above the top Luer-Lok® fitting, so that no trapped bubbles were permitted to reside in the cell aperture. Then the top Luer-Lok® fitting on the Harrick cell was capped with the Teflon® TFE plug, and the cell was inverted with the syringe still attached. The syringe was twisted off and the thus exposed cell fitting was capped with another Teflon® TFE plug.

Loading the Harrick Cell in Nitrogen (Nitrogen Dry Box)

A cleaned and assembled cell was placed into either the $N_2$ purged antechamber of a Series 100 Plexiglass Glove Box (Terra Universal, Anaheim Calif.) or a previously nitrogen-flushed mini chamber attached to a nitrogen purged Nexus model 100043 Dry Box (Vacuum Atmospheres Co., Hawthorne, Calif.). The antechamber was continually purged with house nitrogen until the oxygen meter on the dry box read 1 ppm $O_2$—approximately 30 minutes. The mini chamber was evacuated then filled with nitrogen three times prior to transfer of the equipment to the dry box.

The manner of specimen introduction into the Harrick Cell was as described in the previous section.

Loading a Dried Sample into the Harrick Cell in Nitrogen (Nitrogen Dry Box)

A cleaned, assembled cell, with Teflon® TFE plugs (separate; not inserted), a clean 1 ml BD syringe and the selected sample that had been dried over adsorbents still in the sample bottle, were-placed in the dry box described above in the manner described.

The sample bottle was opened and the liquid poured into a clean 15 ml BD syringe with a 0.45 micrometer PTFE Luer-Lok® filter. Using the syringe, the liquid was transferred through the filter into a clean, dry 20 ml vial. Approximately 0.5 ml of the thus filtered sample was transferred into the cell as described above.

Absorbance Determination

For the purpose of the examples herein below, the absorbance of a material was determined using the relative transmission methods described above, for various cell thicknesses. The thickness of the test specimen was adjusted so that absorbance of at least 0.1% was achieved in order to keep measurement error the same across multiple specimens.

Absorbance was also measured directly using a Varian Cary 5 UV/Vis/NIR spectrometer. While single measurements in the Varian Cary 5 were not as accurate as relative transmission measurements using multiple path length measurements in a VUV-Vase ellipsometer, data acquisition was much less time-consuming.

Index of Refraction Measurements

The index of refraction of the material and its temperature coefficient were determined using the minimum deviation prism method (Woollam Co., LMD™ index measurement) as described in Sinnock et al. Phys. Rev., 181 (3), p. 1297ff (1969) using the VUV-vase and the DUV-vase instrument (see for example Burnett et al., "Absolute refractive indices and thermal coefficients of $CaF_2$, $SrF_2$, $BaF_2$, and LiF near 157 nm", Appl. Opt. 41, 2508-2513 (2002) French et al., "Immersion Fluid Refractive Indices Using Prism Minimum Deviation Techniques", Optical Microlithography XVII, SPIE 5377-173, (2004), and R. A. Synowicki, et al *Journal of Vacuum Science And Technology B,* 22, 6, 3450, (2004).

A liquid-filled prism cell was used. The cell was a 60° equilateral, stainless steel, liquid prism, which included two 12.7 mm diameter×2 mm thick $CaF_2$ windows with Viton® polymer o-ring seals, Luer-Lok® fittings for loading samples. The cell was disassembled for cleaning.

Prior to each use the cell was flushed with Vertrel® XF, through both Luer-Lok® fittings using a 1 ml BD glass syringe to flush out the previous specimen. Then the prism cell was dried with air from an air puffer bulb. The cell was then disassembled for cleaning. The $CaF_2$ windows and the stainless steel cell body were cleaned by ultrasonic agitation in closed vials containing Vertrel® XF for 30-60 seconds The $CaF_2$ windows were rubbed with a cotton swab wet with Vertrel® XF after removal from the ultrasonic bath. then dried with air from a puffer bulb. The cell body was removed from the cleaning bottle then dried with air from a puffer bulb The cell was then reassembled.

Loading the Prism Cell in Nitrogen (Nitrogen Dry Box)

A cleaned, assembled cell, Teflon® TFE plugs, a clean 1 ml BD syringe and a sealed bottle of the selected sample material were placed into either the Series 100 Plexiglass Glove Box or the Nexus model 100043 Dry Box as described herein above.

The sample bottle was then opened and approximately 1 ml of the sample was transferred from it, (the fluid had been filtered through a 0.20 micron PTFE filter), following the method previously described herein above to minimize bubble formation.

When the sample was stored with an adsorbent, the liquid was poured into a clean 15 ml BD syringe with a 0.2 micrometer PTFE Luer-Lok® filter. Using the syringe, the liquid was transferred through the filter into a clean, dry 20 ml vial. Approximately 1 ml of the thus filtered sample was transferred into the cell as described above.

Minimum Deviation Index Method

The equilateral liquid prism was mounted on the VASE® which was equipped with a computer controlled, stepper motor driven θ-2θ angle-of-incidence stage. The sample rotation stage and the detector arm rotation stage were controlled separately during the measurement. For a given wavelength and incident angle, the detector arm was swept through a range of angles to determine the transmission angle. This process was repeated for a range of incident angles. Once the minimum deviation angle was determined, the index was determined according to the method of Sinnock et al., op.cit.

The VUV-VASE ellipsometer was used for index measurements at a nominal temperature of 32° C. The DUV-VASE ellipsometer was used for index measurements at a nominal temperature of 22° C.

The work described herein below was performed in glove bags, glove boxes and dry boxes. The glove bag was a polyolefin bag with glove shaped appendages provided for manipulation and a crude seal at the bottom made by folding. The glove box was a homemade box fabricated by glueing together sheets of PMMA boxes, and fitting out the box with regular dry box gloves. The dry box was a commercial box with high quality seals and ports. Applying Henry's law for oxygen concentrations as high as 100 ppm in nitrogen still results in only parts per billion dissolved oxygen. There was no experimental evidence that the type of enclosure (glove bag, glove box, or dry box) employed made a difference in results and consequently; accordingly, the same type of enclosure was not necessarily used in each step within an example and/or among the examples.

Comparative Example 1

The index of refraction of deionized water, with a conductivity of 17.5 megohms at 32 ° C. was measured and found to be 1.433 at 193 nm and 1.377 at 248 nm. The index of refraction at 22° C. was measured and found to be 1.436 at 193 nm and 1.378 at 248 nm.

Example 1

Preparation of Decahydro-2-trifluoromethyl-2,3,3-trifluoro-1,4:5,8-dimethanonaphthalene A 400 ml autoclave was charged with a reaction mixture formed by combining fresh distilled cyclopentadiene (110 g) and hexafluoropropylene (120 g, DuPont). The mixture was heated at 200° C. for 48 hours. Three identical reaction mixtures were prepared and combined and distilled at reduced pressure to give 5-trifluoromethyl-5,6,6-trifluorobicyclo[2,2,1]hept-2-ene (160.5 g, bp <47° C./0.4 Torr, yield 31%) and octahydro-6-trifluoromethyl-6,7,7-trifluoro-1,4:5,8-dimethanonaphthalene (268.6 g, bp 65-81° C./0.3 Torr, yield 40%).

A 400 ml autoclave was charged with octahydro-6-trifluoromethyl-6,7,7-trifluoro-1,4:5,8-dimethanonaphthalene (177 g, prepared as described above), methanol (100 ml, Burdick & Jackson, HPLC grade), and palladium on activated carbon (lg containing 10% Pd, Alfa products, powder). The autoclave was closed and sealed, then shaken under 50 psig hydrogen pressure for 1 hour at room temperature. The hydrogen pressure was gradually increased to 200 psig over next hour at room temperature followed by an increase to 600 psig at 150° C., maintained for 2 hours. After being cooled to room temperature, the reaction mixtures from two identical runs were combined and filtered to remove the catalyst. The filtrate was mixed with water (200 ml). The organic layer was isolated, diluted with methylene chloride (250 ml) and washed with water (100 ml), dried over $Na_2SO_4$ (EM Science, anhydrous granular). After removal of Na2SO4, the solution was distilled to remove the solvent and further distilled at reduced pressure Decahydro-2-trifluoromethyl-2,3,3-trifluoro-1,4:5,8-dimethanonaphthalene (269 g, bp 114-117° C./2 Torr, yield 75%). The fluid was transferred to a clean bottle (VWR, VWR® TraceClean™ bottle with Teflon® TFE -lined closure) and purged with nitrogen. The bottle was added to activated silica gel (about ⅓ in volume of the fluid) in a dry box. Silica gel (Aldrich catalog number 24,982-3, type 3, 8 mesh) was dried at 500° C. for two hours before use. The bottle was closed and shaken for about 30 seconds, then allowed to sit at room temperature for a few days. The fluid was decanted into another clean bottle and added activated silica gel (about ⅓ in volume of the fluid) in a dry box. After a total three such silica gel treatments, the fluid was filtered through an Acrodisc® CR 25 mm syringe filter with 200 nm PTFE membrane (Pall Life Science). Its transparency was measured by the relative transmission method with 0.145, 0.4 and 0.6 cm path length and found to be 1.2 $cm^{-1}$ at 193 nm. It had a refractive index of 1.555 at 193 nm at the measurement temperature of 24° C.

Example 2

Preparation of Decahydro-2-trifluoromethyl-1,4:5,8-dimethanonaphthalene

A 400 ml autoclave was charged with octahydro-6-trifluoromethyl-1,4:5,8-dimethanonaphthalene (125 g, prepared as described in Example 1), methanol (100 ml, Burdick & Jackson, HPLC grade), and palladium on activated carbon (1 g containing 10% Pd, Alfa products, powder). The autoclave was closed and sealed, then shaken under 50 psig hydrogen pressure for 1 hour at room temperature. The hydrogen pressure was gradually increased to 200 psig over next hour at room temperature followed by 600 psig at 150° C. for 2 hour. After being cooled to room temperature, the reaction mixture was filtered to remove the catalyst. The filtrate was divided into two layers. The bottom layer was isolated and washed with water (2×50 ml), dried over $Na_2SO_4$ (EM Science, anhydrous granular). After removal of $Na_2SO_4$, the liquid was distilled to give decahydro-2-trifluoromethyl-1,4:5,8-dimethanonaphthalene (92.3 g, bp 59-60° C./0.15 Torr, yield 73%).

Further purification: About 40 g of decahydro-2-trifluoromethyl-1,4:5,8-dimethanonaphthalene was mixed with conc. sulfuric acid (5 ml). The resulting mixture was stirred at room temperature for 24 hours. The top layer was isolated and washed with $NaHCO_3$ (0.5M), water, dried over $Na_2SO_4$. After removal of $Na_2SO_4$, the liquid was distilled to give a fluid. The fluid was transferred to a clean bottle (VWR, VWR® TraceClean™ bottle with Teflon® TFE-lined closure) and purged with nitrogen. The bottle was added activated silica gel as provided in Example 1 (about ⅓ in volume of the fluid) in a dry box. The bottle was closed and shaken for about 30 seconds, then allowed to sit at room temperature for a few days. The fluid was filtered through an Acrodisc® CR 25 mm syringe filter with 200 nm PTFE membrane (Pall Life Science). The filtered fluid had an absorbance 2.0 $cm^{-1}$ at 193 nm when measured by the cuvette method with a 0.1 cm path length. It had a refractive index 1.60 at 193 nm at the measurement temperature of 22° C.

Example 3

The apparatus employed for performing contact photolithography at 193 nm is depicted in FIG. 1. It consisted of a 193 nm Lambda-Physik (Ft. Lauderdale, Fla.) Optex ArF Excimer laser light source, a model D200 Scientech (5649 Arapahoe Avenue, Boulder, Colo. 80303) laser power meter, and an immersion fluid reservoir, all mounted on a 24" (61 cm)×18" (46 cm) optical table (Newport Corp., Irvine Calif.), positioned in a nitrogen flushed Nexus Dry Box (VAC Industries, Hawthorne Calif.) equipped with a trace oxygen analyzer and moisture probe (VAC Industries).

Test specimens were submerged 1 mm deep in the selected suitable polycyclic fluoroalkane in the reservoir as shown in FIG. 2. The laser beam traversed a distance of approximately 12" before being directed vertically downward towards the target surface as shown in FIG. 2. The target surface was a 100 mm diameter×0.5 mm thick silicon wafer mounted in a an aluminum holder. The holder was mounted on a rail so that the sample assembly could be translated horizontally. A manually controlled shutter was placed in the beam path as shown. An aluminum aperture plate, 9 cm×9 cm×0.3 cm with a 0.5×0.5 cm machined opening in the center was position into the beam path so as to select the most uniform section of the beam, 0.25 $cm^2$, for lithographic processing. The Scientech power meter, as shown, was used to measure the total exposure energy per unit area. After monitoring a consistent energy of typically 0.1 milliJoules per cm2, the sample holder was slid into place.

Immersion fluid was dispensed into the reservoir of FIG. 3 using a glass hypodermic syringe, (Popper & Sons inc., New Hyde Park N.Y.) with a chrome Luer-Lock tip. Attached to the tip was a 0.2 micrometer PTFE membrane syringe filter, (Pall Gelman Laboratory, Ann Arbor, Mich.).

Sample Preparation

Single crystal silicon wafers, (Wafernet, Inc., San Jose Calif., 100 mm diameter×0 5 mm thick, polished on one side and having a natural oxide layer, approximately 2 nm thick, were prepared for 193 nm photolithography using the following procedure. The silicon wafers were coated in a YES-3 Vapor-Prime Oven (Yield Engineering Company, San Jose Calif.), with a layer of hexamethyldisilizane (HMDS) (Arch Chem. Ind, Norwalk, Conn.) used as an adhesion promoter for the photoresist.

The wafer was spin-coated with a photoresist polymer using a CEE Model 100CB Spinner/Hotplate, (Brewer Science Inc., Derby England). The photoresist was a terpolymer of 1) tetrafluoroethylene (TFE), 2) a norbornene fluoroalcohol (NBFOH), and 3) t-butyl acrylate (t-BAc) as represented by the structure

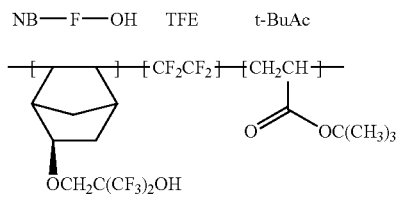

The polymer was prepared by free radical solution polymerization using peroxydicarbonate initiator and a hydrofluorocarbon solvent, as described in A. E. Feiring et al., "Design of Very Transparent Fluoropolymer Resists for Semiconductor Manufacture at 157 nm" Journal of Fluorine Chemistry, 122, 11-16, (2003). The photoresist polymer composition was 33% TFE, 43% NBFOH and 24% t-BA. The spinning solution for the formulated photoresist consisted of a 15 weight percent photoresist polymer dissolved in a 2-heptanone solvent with an additional 2 wt % of triphenylsulfonium nonaflate (TPS-Nf) present to serve as the photoacid generator (PAG) and 0.2 wt % of tetrabutylammonium lactate (TBALac) to serve as the contrast enhancing base additive The weight percent is by weight of the total, including the weight of the spinning solvent. For details of this resist formulation and processing see M. K. Crawford et al., "Single Layer Fluoropolymer Resists for 157 nm Photolithography at 157 nm exposure wavelength", Advances in Resist Technology and Processing XVIII , SPIE Vol. 5039, (2003), and also A. E. Feiring et al., op. cit.

Approximately 1 ml of the photoresist solution so prepared was dispensed through a 0.2 micrometer polytetrafluoroethylene syringe filter onto the HMDS vapor primed coated wafer and the wafer was spun-coated at 2500 rpm for 60 seconds in air and then a post apply bake (PAB) of the resist was done at 150° C. for 60 seconds The photoresist films were visually inspected and the thickness of each film measured using a Filmetrics film thickness instrument (Filmetrics Inc., San Diego Calif.).

1 ml of Teflon® TFE AF (The DuPont Company) was dispensed onto the photoresist-coated wafer and the wafer was spun at 2500 rpm for 1 minute. The sample was then transferred into the VAC Dry Box and placed into the sample holder.

A contact mask was formed using SPI Copper TEM Grids, (SPI Inc. West Chester Pa.,), 3 mm diameter×50 mesh, with a lateral periodicity of 500 micrometers, and line widths of 100 microns by placing the grids end to end across the entire wafer in the beam exposure path. The photoresist coated wafer was immersed to a fluid depth of approximately 1 mm by dispensing approximately 20 milliters of suitable polycyclic fluoroalkane through a glass syringe with a 0.2 micron filter over the entire 100 mm diameter of the top coat/photoresist/HMDS primed silicon wafer.

Sequential exposure was effected by physically translating the wafer into the exposure zone by ½ cm increments along a slide rail mounted on the optical table thereby providing a series of ½ cm strips of increasing dosage. After exposure the suitable polycyclic fluoroalkane was pipetted off and the contact masks were removed. The exposed wafer was then transferred out of the VAC Dry Box and post-exposure baked at 135° C. for 60 seconds in air on the CEE Model 100CB Hotplate. The Top Coat was then removed from the wafer by spin cleaning on the CEE Model 100CB spinner, by dispensing FC-75 solvent over the top surface of the wafer, then spinning the wafer at 2500 rpm for 60 seconds in air. The thus exposed photoresist was then developed using Shipley LDD-26W Developer (Shipley Company, L.L.C., Marlborough Mass.), by immersion in the developer for 60 seconds at room temperature, in air. Then the sample was immersed in deionized (D.I.) water for 10 to 15 seconds, removed from the water bath, rinsed with a D.I. water spray and blown dry with nitrogen gas.

The dried samples were visually and microscopically inspected to determine the contact print dose, E1 Dry, which refers to the minimum exposure energy required for image formation in the absence of an immersion liquid, and the contact print dose E1 Wet, which refers to the minimum exposure energy required for image formation in the presence of a given immersion liquid.

Example 3A

The photoresist layer prepared as described above was 260 nm thick. The photoresist layer was coated with a topcoat as described above. The topcoat solution was prepared by combining 4.1 wt-% Teflon® TFE AF 1601 in FLUORINERT™ FC-75. The topcoat layer so prepared was 200 nm thick. This wafer, dry (without immersion fluid), was then exposed to 193 nm light. E1 Dry, the exposure dose required to clearly transfer the TEM Copper grid image onto the photoresist was found to be 3.2 mJ/cm$^2$

Example 3B

The procedure of Example 3A was repeated except that the immersion fluid of Example 1 was used, Decahydro-2-trifluoromethyl-2,3,3-trifluoro-1,4:5,8-dimethanonaphthalene, with an optical absorbance of 1.36/cm at a fluid thickness of 1 milliter. E1 Wet, the exposure dose required to clearly transfer the TEM Copper grid image onto the photoresist, was found to be 3.6 mJ/cm$^2$

Example 4

Preparation of a Non-fluorinated Model Compound

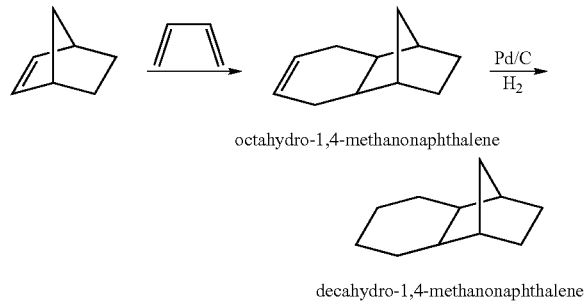

octahydro-1,4-methanonaphthalene decahydro-1,4-methanonaphthalene

Preparation of decahydro-1,4-methanonaphthalene

Step One: Preparation of octahydro-1,4-methanonaphthalene
A 400 ml autoclave was charged with bicyclo[2,2,1]-2-heptene (152 g, Aldrich), 4-methylphenol (1 g, Aldrich), and butadiene (110 g). The mixture was heated at 200° C. for 10 hours. The reaction mixtures from four identical reactions were combined and distilled at atmosphere to give starting bicyclo[2,2,1]-2-heptene (307 g). Further distillation at reduced pressure afforded octahydro-1,4-methanonaphthalene (349 g with 97-98% purity, bp 47° C./0.05 Torr, yield 73%, based on consumed bicyclo[2,2,1]-2-heptene) and about 120 g of product with lower purity (bp 47° C./2 Torr to 58° C./0.16 Torr).

Step Two: Preparation of decahydro-1,4-methanonaphthalene
A 400 ml autoclave was charged with octahydro-1,4-methanonaphthalene (122 g, prepared as described above), methanol (100 ml, Burdick & Jackson, HPLC grade), and palladium on activated carbon (1.5 g containing 10% Pd, Alfa products, powder). The autoclave was closed and sealed, then shaken under 50 psig hydrogen pressure for 20 minutes at room temperature. The hydrogen pressure was increased to 200 psig for 10 minutes at room temperature followed by 600 psig at 70° C. for 45 minutes. Three identically prepared reaction mixtures were combined and filtered to remove the catalyst. The filtrate separated into two layers. The MeOH layer (top layer) was isolated and concentrated to give a residue, which was combined with product layer (the bottom layer). The combined crude product was distilled at reduced pressure to give decahydro-1,4-methanonaphthalene (318.6 g, bp 71-73° C./0.2 Torr, yield 86%).

Example 5

Preparation of decahydro-2-trifluoromethyl-1,4-methanonaphthalene

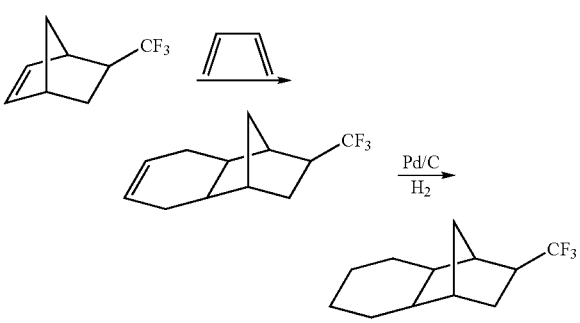

Step One: Preparation of octahydro-trifluoromethyl-1,4-methanonaphthalene
A 400 ml autoclave is charged with 5-trifluoromethylbicyclo[2,2,1]-2-heptene (262 g, preparation is included in example 1 of CL 2910), 4-methylphenol (1 g), and butadiene (110 g). The mixture is heated at 200° C. for 10 hours. The octahydro-2-trifluormethyl-1,4-methanonaphthalene product is purified by distillation at reduced pressure.

Step Two: Preparation of decahydro-2-trifluoromethyl-1,4-methanonaphthalene
A 400 ml autoclave is charged with 177 g of the thus purified octahydro-2-trifluormethyl-1,4-methanonaphthalene, methanol (100 ml, Burdick & Jackson, HPLC grade), and palladium on activated carbon (1.5 g containing 10% Pd, Alfa products, powder). The autoclave is closed and sealed, then it is shaken under 50 psig hydrogen pressure for 20 minutes at room temperature. The hydrogen pressure is increased to 200 psig for 10 minutes at room temperature followed by 600 psig at 70° C. for 45 minutes. The decahydro-2-trifluormethyl-1,4-methanonaphthalene product is purified by distillation at reduced pressure. The distilled product is then treated with concentrated sulfuric acid followed by silica gel treatment similar to what described in the example 2.

Comparative Example 2

The same procedures were followed as in Example 3A except that no immersion fluid and no topcoat were used. The photoresist layer was 246 nm thick. E1 was found to be 1.2 mJ/cm$^2$ was required to effect clean image formation in the photoresist. The copper TEM grid pattern transferred to the wafer is shown in FIG. 16.

What is claimed is:
1. A process comprising:
providing a light source emitting ultraviolet light within the wavelength range of about 190 to about 260 nm; providing a target having a surface; imagewise illuminating at least a portion of a target surface with the emitted light; and disposing in at least a portion of the emitted light between the light source and the target surface a polycyclic fluoroalkane such that at least a portion of the emitted light illuminating the target surface is transmitted through the polycyclic fluoroalkane, the polycyclic fluroalkane having an F/H ratio of 0.5 or less but greater than zero, a refractive index of $\geqq 1.50$ and an absorbance at 193 nm of 2.0 cm$^{-1}$ or less wherein said polycyclic fluoroalkane is represented by the structure I

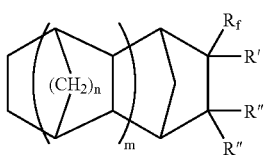

I where $R_f$ is a fluorinated alkyl radical of 1-10 carbons that are linear, branched, or cyclic; R': is H, F, an alkyl radical of 1-6 carbons that are linear, branched, or cyclic, or a fluorinated alkyl radical of 1-6 carbons that are linear, branched, or cyclic;

each R" is independently H or F; n=0 or 1; and m=1 or 2 provided that m is not 2 when n=0.

2. The process of claim 1 wherein $R_f$ is fluorinated cyclic alkyl or trifluoromethyl, and R' is H, F or trifluoromethyl, and each R" is independently H or F.

3. An apparatus comprising a light source capable of emitting light in the wavelength range of about 190 to about 260 nm, a target surface disposed so that upon activation of the light source at least a portion of the target surface is imagewise illuminated by the light emitted from the light source, and a polycyclic fluoroalkane disposed between the light source and the target surface such that at least a portion of the emitted light illuminating the target surface is transmitted through the polycyclic fluoroalkane; the polycyclic fluroalkane having an F/H ratio of 0.5 or less but greater than zero, a refractive index of at least 1.50, and an absorbance at 193 nm of 2.0 cm$^{-1}$ or less wherein said polycyclic fluoroalkane is represented by the structure I

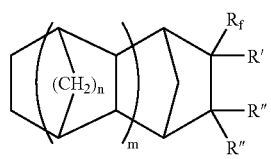

I where $R_f$ is a fluorinated alkyl radical of 1-10 carbons that is linear, branched, or cyclic; R' is H, F, an alkyl radical of 1-6 carbons that are linear, branched, or cyclic, or a fluorinated akyl radical of 1-6 carbons that are linear, branched, or cyclic; each R" is independently H or F, n=0 or 1, and m=1 or 2 provided that m is not 2 when n=0.

4. The apparatus of claim 3 wherein $R_f$ is fluorinated cyclic alkyl or trifluoromethyl, and R' is H, F or trifluoromethyl, and each R" are H or F.

5. The apparatus of claim 3 wherein the apparatus is enclosed within an oxygen-minimized atmosphere.

* * * * *